(12) United States Patent
Yeom et al.

(10) Patent No.: US 10,593,819 B2
(45) Date of Patent: Mar. 17, 2020

(54) SEMICONDUCTOR DEVICE, PHOTOELECTRONIC DEVICE, AND METHOD FOR MANUFACTURING TRANSITION-METAL DICHALCOGENIDE THIN FILM

(71) Applicant: RESEARCH & BUSINESS FOUNDATION SUNGKYUNKWAN UNIVERSITY, Suwon-si (KR)

(72) Inventors: Geun Young Yeom, Seoul (KR); Ki Seok Kim, Incheon (KR); Ki Hyun Kim, Daejeon (KR); Jin Woo Park, Goyang-si (KR); Doo San Kim, Suncheon-si (KR); You Jin Ji, Gunpo-si (KR); Ji Young Byun, Suwon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 16/050,063

(22) Filed: Jul. 31, 2018

(65) Prior Publication Data

US 2019/0044009 A1 Feb. 7, 2019

(30) Foreign Application Priority Data

Aug. 1, 2017 (KR) .......................... 10-2017-0097527

(51) Int. Cl.
*H01L 31/0392* (2006.01)
*H01L 31/18* (2006.01)
(Continued)

(52) U.S. Cl.
CPC ...... *H01L 31/0392* (2013.01); *H01L 31/0324* (2013.01); *H01L 31/035272* (2013.01);
(Continued)

(58) Field of Classification Search
None
See application file for complete search history.

(56) References Cited

U.S. PATENT DOCUMENTS

2007/0163383 A1* 7/2007 Van Duren ........... B22F 1/0055
75/255
2010/0267222 A1* 10/2010 Robinson .............. B22F 1/0055
438/502

OTHER PUBLICATIONS

Howell, S., et al., "Investigation of Band-Offsets at Monolayer-Multilayer MoS2 Junctions by Scanning Photocurrent Microscopy", *American Chemical Society*, 2015, 2278-2284 (7 pages in English).
(Continued)

*Primary Examiner* — Michelle Mandala
(74) *Attorney, Agent, or Firm* — NSIP Law (57) ABSTRACT

The present disclosure relates to a semiconductor device and a photoelectronic device, both including a transition-metal dichalcogenide thin-film, and to a method for producing a transition-metal dichalcogenide thin-film. The transition-metal dichalcogenide thin-film includes: a first region including a stack of N+M transition-metal dichalcogenide molecular layers; and a second region including a stack of N transition-metal dichalcogenide molecular layers, wherein the second region is horizontally adjacent to the first region, wherein the N transition-metal dichalcogenide molecular layers of the second region respectively horizontally extend from the N transition-metal dichalcogenide molecular layers of the first region.

8 Claims, 4 Drawing Sheets

(51) Int. Cl.
*H01L 31/0352* (2006.01)
*H01L 31/032* (2006.01)
*H01L 31/112* (2006.01)

(52) U.S. Cl.
CPC ............ *H01L 31/112* (2013.01); *H01L 31/18* (2013.01); *Y02E 10/50* (2013.01); *Y02P 70/521* (2015.11)

(56) References Cited

OTHER PUBLICATIONS

Kallatt, S. et al., "Photoresponse of Atomically Thin MoS2 Layers and Their Planar Heterojunctions", *The Royal Society of Chemistry* Jun. 20, 2016, 15213-15222 (10 pages in English).

* cited by examiner

SEMICONDUCTOR DEVICE, PHOTOELECTRONIC DEVICE, AND METHOD FOR MANUFACTURING TRANSITION-METAL DICHALCOGENIDE THIN FILM

CROSS-REFERENCE TO RELATED APPLICATIONS

This application claims the priority of Korean Patent Application No. 10-2017-0097527 filed on Aug. 1, 2017, in the Korean Intellectual Property Office, the disclosure of which is hereby incorporated by reference in its entirety.

BACKGROUND

1. Technical Field

The present disclosure relates to a semiconductor device, a photoelectronic device, and to a method for manufacturing a transition-metal dichalcogenide thin-film. More particularly, the present disclosure relates to a semiconductor device and a photoelectronic device, both including a transition-metal dichalcogenide thin-film, and to a method for producing a transition-metal dichalcogenide thin-film.

2. Description of the Related Art

Transition-metal dichalcogenides (TMDs) are compounds including a bond between a transition-metal atom (M) and a chalcogen atom (X). The TMD compound defines a two-dimensional material with a layered structure in which molecular layers is combined to each other via weak van der Waals force. In the case of $MoS_2$, which is one of the representative TMD compounds, its bulk has an indirect band gap of 1.2 eV, while its monolayer has a direct band gap of 1.9 eV. That is, the bandgap thereof varies depending on the thicknesses. Other TMD compounds besides $MoS_2$ also have changes in physical and chemical properties, including bandgaps characteristics based on the number of TMD molecular layers, that is, thicknesses thereof.

There have been attempts to partially separate the molecular layers made of the TMD compound using the above properties of the TMD compounds. However, in the case of performing the above-described separation in the same manner as mechanical peeling, such as using a adhesive tape, it is almost impossible to form TMD-based multiple junctions. If possible, during the mechanical stripping process, hetero-junctions are accidentally formed. Thus, there is a problem that a hetero-junction may not be formed to have the target number and pattern of the layers.

For this reason, there is a further need for research and development of a new technique that may control the TMD layer without damage and form a TMD having different numbers of molecular layers at the desired locations.

SUMMARY

One purpose of the present disclosure is to provide a semiconductor device comprising a transition-metal dichalcogenide thin-film having regions with different numbers of molecular layers.

Another purpose of the present disclosure is to provide a photoelectronic device comprising a transition-metal dichalcogenide thin-film having regions with different numbers of molecular layers.

Still another purpose of the present disclosure is to provide a method for manufacturing a transition-metal dichalcogenide thin-film having regions with different numbers of molecular layers.

The purposes of the present disclosure are not limited to the above-mentioned purposes. Other purposes and advantages of the present disclosure, as not mentioned above, may be understood from the following descriptions and more clearly understood from the embodiments of the present disclosure. Further, it will be readily appreciated that the objects and advantages of the present disclosure may be realized by features and combinations thereof as disclosed in the claims.

In a first aspect of the present disclosure, there is provided a semiconductor device comprising: a substrate; and a transition-metal dichalcogenide thin-film disposed on the substrate, wherein the transition-metal dichalcogenide thin-film includes: a first region including a stack of N+M transition-metal dichalcogenide molecular layers; and a second region including a stack of N transition-metal dichalcogenide molecular layers, wherein the second region is horizontally adjacent to the first region, wherein the N transition-metal dichalcogenide molecular layers of the second region respectively horizontally extend from the N transition-metal dichalcogenide molecular layers of the first region.

In one implementation of the semiconductor device, the transition-metal dichalcogenide thin-film include at least two pairs of the first region and the second region.

In one implementation of the semiconductor device, the transition-metal dichalcogenide thin-film further includes a third region, wherein the third region is horizontally adjacent to the second region, wherein the stack of the N molecular layers of the second region is divided into a lower stack of Z molecular layers and an upper stack of L molecular layers, wherein the third region includes a stack of Z further molecular layers, wherein the Z further molecular layers of the third region extend respectively horizontally from the Z molecular layers of the second region.

In one implementation of the semiconductor device, the molecular layer is made of a compound between one atom of transition-metal selected from molybdenum (Mo), tungsten (W), tin (Sn), cadmium (Cd), and zinc (Zn), and two atoms of chalcogen selected from selenium (Se) sulfur (S), and tellurium (Te).

In a second aspect of the present disclosure, there is provided a photoelectronic device comprising: a substrate; and a transition-metal dichalcogenide thin-film disposed on the substrate; and electrodes disposed on the transition-metal dichalcogenide thin-film, wherein the transition-metal dichalcogenide thin-film includes: a first region including a stack of N+M transition-metal dichalcogenide molecular layers; and a second region including a stack of N transition-metal dichalcogenide molecular layers, wherein the second region is horizontally adjacent to the first region, wherein the N transition-metal dichalcogenide molecular layers of the second region respectively horizontally extend from the N transition-metal dichalcogenide molecular layers of the first region.

In one implementation of the photoelectronic device, the transition-metal dichalcogenide thin-film include at least two pairs of the first region and the second region.

In one implementation of the photoelectronic device, the transition-metal dichalcogenide thin-film further includes a third region, wherein the third region is horizontally adjacent to the second region, wherein the stack of the N molecular layers of the second region is divided into a lower stack of Z molecular layers and an upper stack of L molecular layers, wherein the third region includes a stack of Z further molecular layers, wherein the Z further molecular layers of the third region extend respectively horizontally from the Z molecular layers of the second region.

In one implementation of the photoelectronic device, the molecular layer is made of a compound between one atom of transition-metal selected from molybdenum (Mo), tungsten (W), tin (Sn), cadmium (Cd), and zinc (Zn), and two atoms of chalcogen selected from selenium (Se) sulfur (S), and tellurium (Te).

In one implementation of the photoelectronic device, the photoelectronic device includes at least one of a photodetector, a photodiode, and a phototransistor.

In a third aspect of the present disclosure, there is provided a method for producing a transition-metal dichalcogenide thin-film, the method includes a first process, wherein the first process includes: forming a first mask pattern on a transition-metal dichalcogenide thin-film including N+M molecular layers; and etching the transition-metal dichalcogenide thin-film using the first mask pattern via an atomic layer etching (ALE) process, thereby to form a patterned transition-metal dichalcogenide thin-film, wherein the patterned transition-metal dichalcogenide thin-film includes: a first region including a stack of N+M transition-metal dichalcogenide molecular layers; and a second region including a stack of N transition-metal dichalcogenide molecular layers, wherein the second region is horizontally adjacent to the first region, wherein the N transition-metal dichalcogenide molecular layers of the second region respectively horizontally extend from the N transition-metal dichalcogenide molecular layers of the first region.

In one implementation of the method, the etching of a single molecular layer is repeated M times.

In one implementation of the method, the method further comprises a second process, wherein the second process includes: forming a second mask pattern on the patterned transition-metal dichalcogenide thin-film and in the second region thereof; and further-etching the patterned transition-metal dichalcogenide thin-film in the second region using the second mask pattern via an atomic layer etching (ALE) process, thereby to form a further patterned transition-metal dichalcogenide thin-film, wherein the further patterned transition-metal dichalcogenide thin-film further includes: a third region including N−K molecular layers.

In one implementation of the method, the further-etching of a single molecular layer is repeated K times.

In one implementation of the method, a third mask pattern is formed on the patterned transition-metal dichalcogenide thin-film and in the first region thereof including the N+M molecular layers, wherein the further-etching is performed in a portion of the first region as the same time as the etching of the second region, such that the further patterned transition-metal dichalcogenide thin-film further includes a fourth region including N+M-K molecular layers in the etched portion of the first region.

According to the semiconductor device of the present disclosure, the photoelectronic device of the present disclosure, and the method for manufacturing the transition-metal dichalcogenide thin-film of the present disclosure, the transition-metal dichalcogenide thin-film has hetero-junctions between the localized regions having different numbers of molecular layers, which are defined by selectively etching locally the target molecular layers in the layered structure of the transition-metal dichalcogenide composed of the single compound, that is, the transition-metal dichalcogenide.

The transition-metal dichalcogenide thin-film comprising regions having the different numbers of molecular layers using selective thickness control (number of molecular layers) according to the present disclosure may have following properties: high photocurrent due to the work function difference resulting from the different band gaps between the regions having different thicknesses and difference in electron affinity between the regions having different thicknesses may occur at the hetero-junction formed between the regions having different numbers of the molecular layers. Further, the hetero-junctions may be formed, which may improve optical properties such as photoresponsivity. These properties may provide for various functional devices such as the semiconductor device and the photoelectronic device including the transition-metal dichalcogenide thin-film according to the present disclosure. The functional device comprising the transition-metal dichalcogenide thin-film according to the present disclosure has excellent electrical and optical properties and may exhibit excellent device performance.

Further, the specific effects of the present disclosure as well as the effects as described above will be described in conduction with illustrations of specific details for carrying out the present disclosure.

DETAILED DESCRIPTION

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The same reference numbers in different figures. denote the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for describing particular embodiments only and is not intended to be limiting of the present disclosure. As used herein, the singular forms "a" and "an" are intended to include the plural forms as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1A:
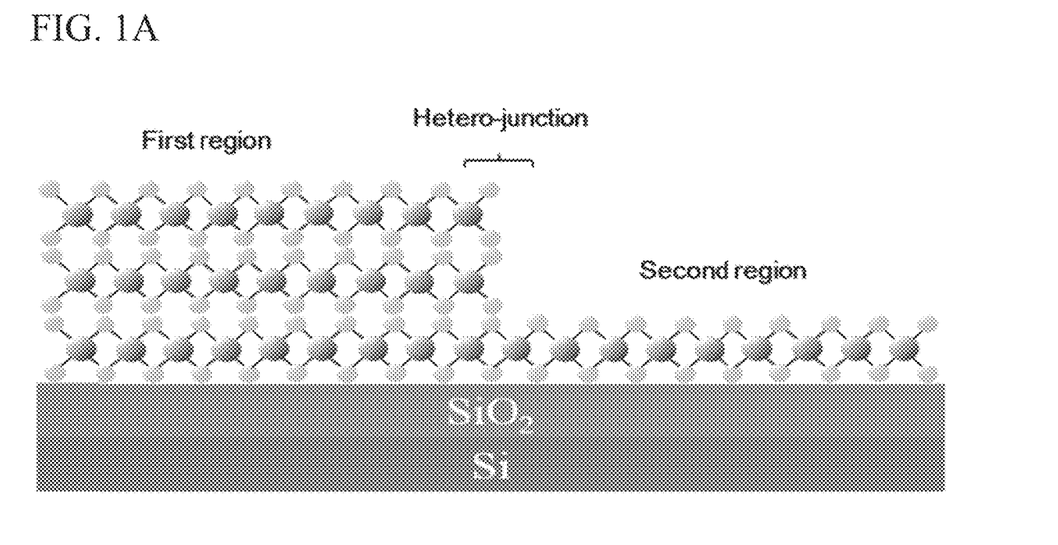
FIGS. 1A to 1C illustrate a semiconductor device of the present disclosure.
Figure 1B:
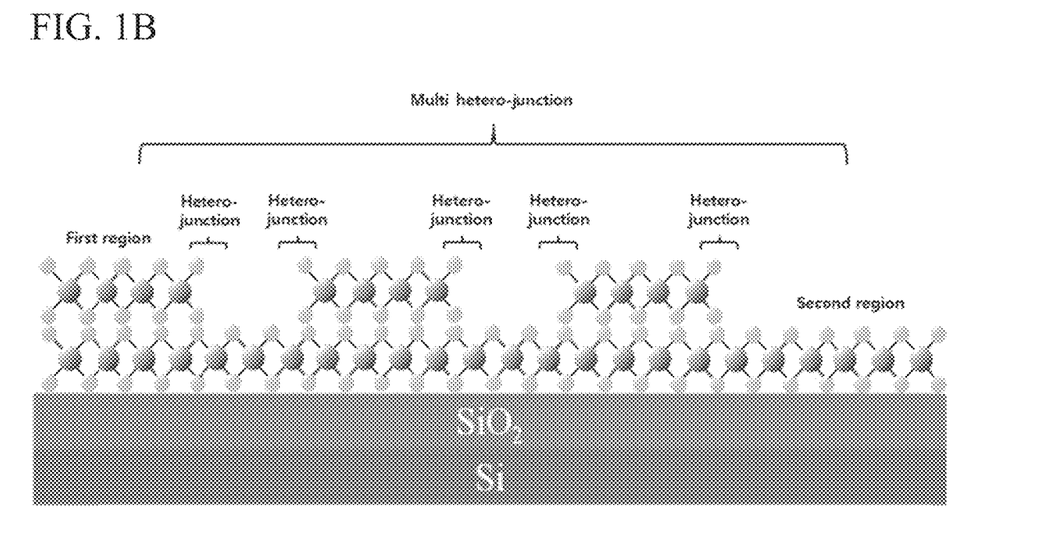
Figure 1C:
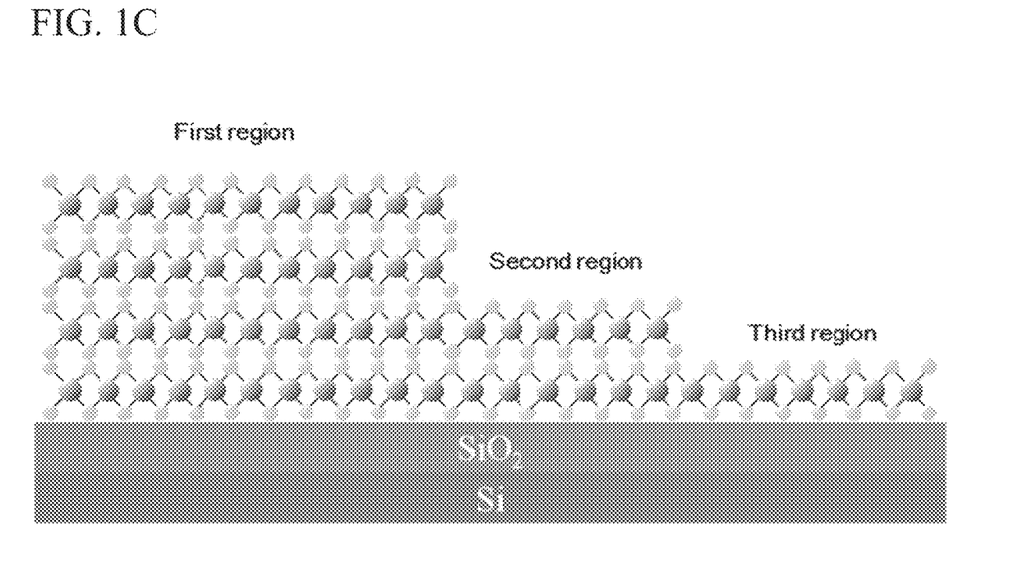

FIGS. 1A to 1C illustrate the semiconductor device according to the present disclosure.

Referring to FIGS. 1A to 1C, the semiconductor device of the present disclosure includes a substrate and a transition-metal dichalcogenide thin-film disposed on the substrate. The transition-metal dichalcogenide thin-film of the present disclosure includes a first region, which includes a stack of N+M transition-metal dichalcogenide molecular layers, and a second region, which includes a stack of N transition-metal dichalcogenide molecular layers, wherein the second region is horizontally adjacent to the first region, wherein the N transition-metal dichalcogenide molecular layers of the second region respectively horizontally extend from the N transition-metal dichalcogenide molecular layers of the first region.

In this connection, each of N and M are positive integers. That is, the N transition metal dichalcogenide molecular layers may include at least one layer.

In the present disclosure, the substrate is not particularly limited as long as the substrate is used in a general semiconductor device. In one embodiment, a Si/SiO$_2$ substrate may be used.

Chalcogenide is a compound composed of at least one chalcogen element and at least one electropositive element. In this regard, transition-metal dichalcogenide (TMD) may be a compound between a transition-metal atom (M) and two chalcogen atoms (X) and may generally represented by MX$_2$.

In the present disclosure, the transition-metal dichalcogenide may be a compound between one atom of transition-metal selected from molybdenum (Mo), tungsten (W), tin (Sn), cadmium (Cd), and zinc (Zn), and two atoms of chalcogen selected from selenium (Se) sulfur (S), and tellurium (Te).

In one example, the transition-metal dichalcogenide of the present disclosure may be a compound MoS$_2$ between one molybdenum (Mo) atom and two sulfur (S) atoms.

In general, a weak van der Waals bond may be generated between the monolayers made of the transition-metal dichalcogenide molecules, thereby forming a two-dimensional material with a layered structure. However, the transition-metal dichalcogenide thin-film of the present disclosure has local regions with different numbers of molecular layers.

To be specific, the transition-metal dichalcogenide thin-film of the present disclosure includes a first region, which includes a stack of N+M transition-metal dichalcogenide molecular layers, and a second region, which includes a stack of N transition-metal dichalcogenide molecular layers, wherein the second region is horizontally adjacent to the first region, wherein the N transition-metal dichalcogenide molecular layers of the second region respectively extend from the N transition-metal dichalcogenide molecular layers of the first region.

In this connection, a hetero-junction is defined between the first region and the second region. the hetero-junction refer to a junction between two materials that differ in energy based on a structure.

In the transition-metal dichalcogenide thin-film of the present disclosure, the first region and the second region may be made of the same material. However, different band gaps and different physical and chemical properties resulting from differences in the number of molecular layers between the first region and the second region, that is, difference in their thicknesses between the first and second regions may be realized. For this reason, the transition-metal dichalcogenide thin-film of the present disclosure may have the hetero-junction defined between the two adjacent regions (the first region and the second region) having the different numbers of the molecular layers.

The transition-metal dichalcogenide thin-film comprising the regions having the different numbers of the molecular layers using selective thickness control (number of molecular layers) according to the present disclosure may have following properties: high photocurrent due to the work function difference resulting from the different band gaps between the regions having different thicknesses and difference in electron affinity between the regions having different thicknesses may occur at the hetero-junction formed between the regions having different numbers of the molecular layers. Further, the hetero-junctions may be formed, which may improve optical properties such as photoresponsivity. These properties may provide for the semiconductor device including the transition-metal dichalcogenide thin-film according to the present disclosure. The semiconductor device comprising the transition-metal dichalcogenide thin-film according to the present disclosure has excellent electrical and optical properties and may exhibit excellent device performance.

A transition-metal dichalcogenide thin-film of the present disclosure may have at least one pair of the first region and the second region.

In one example, when the transition-metal dichalcogenide thin-film of the present disclosure comprises a single pair of the first region and the second region, the transition-metal dichalcogenide thin-film may have one hetero-junction as shown in FIG. 1A.

Alternatively, in another example, when the thin-film has two pairs of the first region and the second region, the transition-metal dichalcogenide thin-film may have a plurality of hetero-junctions respectively defined between the adjacent first and second regions, as shown in FIG. 1B. That is, the multi-hetero-junction is defined.

In this connection, in the transition-metal dichalcogenide thin-film, the first regions and the second regions adjacent to the first regions may be regularly or irregularly arranged to realize various patterns.

Further, in the present disclosure, the transition-metal dichalcogenide thin-film may further include the third region.

Referring to FIG. 1C, when the transition-metal dichalcogenide thin-film contains the third region, the first region includes the N+M molecular layers; the second region includes the N molecular layers; the N molecular layers of the second region include a lower stack of Z molecular layers and an upper stack of L molecular layers. That is, N=Z+L. In this connection, N is at least 2 natural numbers, each of Z and L is a positive integer. The third region is horizontally adjacent to the second region. The third region includes a stack of Z further molecular layers. The Z further molecular layers of the third region extend respectively horizontally from the Z molecular layers of the second region.

In this connection, a hetero-junction may be defined between at least one of the first region and the second region and the third region. The transition-metal dichalcogenide thin-film containing the third region may have multiple hetero-junctions defined between the plurality of regions. In this connection, in one example, in the Z molecular layers, Z may be 1.

In FIG. 1C, the third region is adjacent to the second region. However, in another embodiment of the present disclosure, the third region may be horizontally adjacent to the first region.

That is, the transition-metal dichalcogenide thin-film of the present disclosure may comprise at least one pair of the first region, the second region, and the third region, which are regularly or irregularly horizontally adjacent to each other.

Further, in one example, the transition-metal dichalcogenide thin-film of the present disclosure may further include an n-th region (n being a natural number of 4 or more) including at least one molecular layer and adjacent to the first to third regions.

The transition-metal dichalcogenide thin-film comprising the regions having the different numbers of the molecular layers using selective thickness control (number of molecular layers) according to the present disclosure may have following properties: high photocurrent due to the work function difference resulting from the different band gaps between the regions having different thicknesses and difference in electron affinity between the regions having different thicknesses may occur at the hetero-junction formed between the regions having different numbers of the molecular layers. Further, the hetero-junctions may be formed, which may improve optical properties such as photoresponsivity. These properties may provide for the semiconductor device including the transition-metal dichalcogenide thin-film according to the present disclosure. The semiconductor device comprising the transition-metal dichalcogenide thin-film according to the present disclosure has excellent electrical and optical properties and may exhibit excellent device performance.

Figure 2:
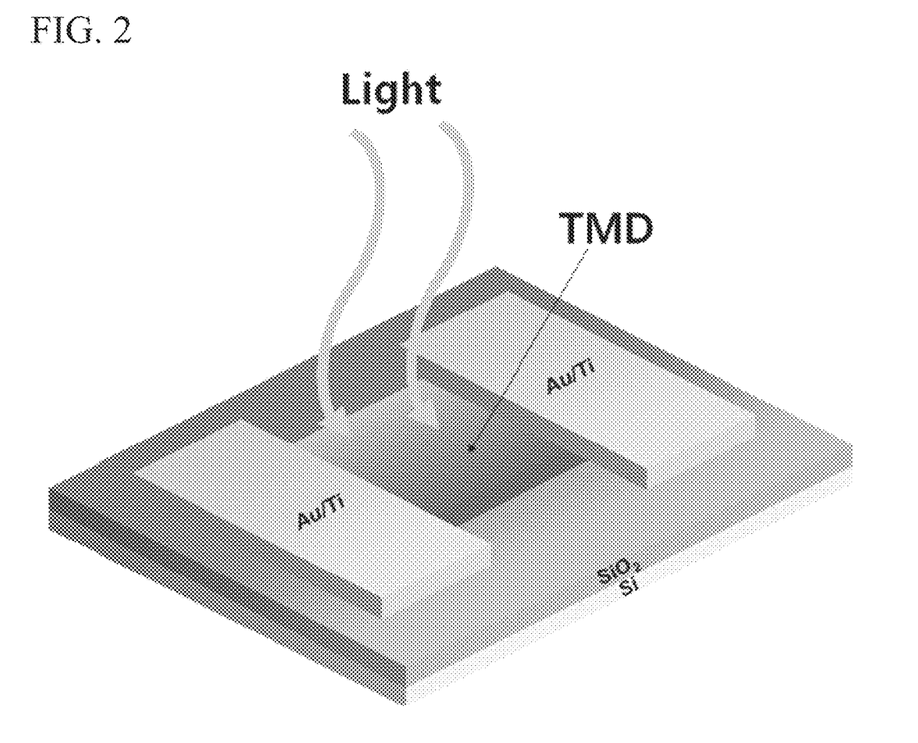
FIG. 2 is an illustration of a photoelectronic device of the present disclosure.

FIG. 2 is an illustration of the photoelectronic device of the present disclosure.

FIG. 2 is an illustration of the structure of a photoelectronic device according to one embodiment of the present disclosure.

Referring to FIG. 2, the photoelectric device of the present disclosure has a substrate; a transition-metal dichalcogenide thin-film; and electrodes disposed on the transition-metal dichalcogenide thin-film. The transition-metal dichalcogenide thin-film of the present disclosure includes a first region, which includes a stack of N+M transition-metal dichalcogenide molecular layers, and a second region, which includes a stack of N transition-metal dichalcogenide molecular layers, wherein the second region is horizontally adjacent to the first region, wherein the N transition-metal dichalcogenide molecular layers of the second region respectively horizontally extend from the N transition-metal dichalcogenide molecular layers of the first region.

In this connection, each of N and M are positive integers. That is, the N transition metal dichalcogenide molecular layers may include at least one layer.

In the present disclosure, the substrate is not particularly limited as long as the substrate is used in a general semiconductor device. In one embodiment, a $Si/SiO_2$ substrate may be used.

Chalcogenide is a compound composed of at least one chalcogen element and at least one electropositive element. In this regard, transition-metal dichalcogenide (TMD) may be a compound between a transition-metal atom (M) and two chalcogen atoms (X) and may generally represented by $MX_2$.

In the present disclosure, the transition-metal dichalcogenide may be a compound between one atom of transition-metal selected from molybdenum (Mo), tungsten (W), tin (Sn), cadmium (Cd), and zinc (Zn), and two atoms of chalcogen selected from selenium (Se) sulfur (S), and tellurium (Te).

In one example, the transition-metal dichalcogenide of the present disclosure may be a compound $MoS_2$ between one molybdenum (Mo) atom and two sulfur (S) atoms.

In general, a weak van der Waals bond may be generated between the monolayers made of the transition-metal dichalcogenide molecules, thereby forming a two-dimensional material with a layered structure. However, the transition-metal dichalcogenide thin-film of the present disclosure has local regions with different numbers of molecular layers.

In one example, the electrodes may be respectively source and drain electrodes disposed on the transition-metal dichalcogenide thin-film and may be spaced apart from each other. The electrode may be an electrode generally available in the field of photoelectronic devices. In one example, in the present disclosure, the electrode may be a metal electrode such as a gold/titanium (Au/Ti) electrode.

To be specific, the transition-metal dichalcogenide thin-film of the present disclosure includes a first region, which includes a stack of N+M transition-metal dichalcogenide molecular layers, and a second region, which includes a stack of N transition-metal dichalcogenide molecular layers, wherein the second region is horizontally adjacent to the first region, wherein the N transition-metal dichalcogenide molecular layers of the second region respectively extend from the N transition-metal dichalcogenide molecular layers of the first region.

In this connection, a hetero-junction is defined between the first region and the second region. the hetero-junction refer to a junction between two materials that differ in energy based on a structure.

In the transition-metal dichalcogenide thin-film of the present disclosure, the first region and the second region may be made of the same material. However, different band gaps and different physical and chemical properties resulting from differences in the number of molecular layers between the first region and the second region, that is, difference in their thicknesses between the first and second regions may be realized. For this reason, the transition-metal dichalcogenide thin-film of the present disclosure may have the hetero-junction defined between the two adjacent regions (the first region and the second region) having the different numbers of the molecular layers.

The transition-metal dichalcogenide thin-film comprising the regions having the different numbers of the molecular layers using selective thickness control (number of molecular layers) according to the present disclosure may have following properties: high photocurrent due to the work function difference resulting from the different band gaps between the regions having different thicknesses and difference in electron affinity between the regions having different thicknesses may occur at the hetero-junction formed between the regions having different numbers of the molecular layers. Further, the hetero-junctions may be formed, which may improve optical properties such as photoresponsivity. These properties may provide for the photoelectronic device including the transition-metal dichalcogenide thin-film according to the present disclosure. The photoelectronic device comprising the transition-metal dichalcogenide thin-film according to the present disclosure has excellent electrical and optical properties and may exhibit excellent device performance.

A transition-metal dichalcogenide thin-film of the present disclosure may have at least one pair of the first region and the second region.

In one example, when the transition-metal dichalcogenide thin-film of the present disclosure comprises a single pair of the first region and the second region, the transition-metal dichalcogenide thin-film may have one hetero-junction.

Alternatively, in another example, when the film has two pairs of the first region and the second region, the transition-metal dichalcogenide thin-film may have a plurality of hetero-junctions respectively defined between the adjacent first and second regions. That is, the multi-hetero-junction is defined.

In this connection, in the transition-metal dichalcogenide thin-film, the first regions and the second regions adjacent to the first regions may be regularly or irregularly arranged to realize various patterns.

Further, in the present disclosure, the transition-metal dichalcogenide thin-film may further include the third region.

Referring to FIG. 1C, when the transition-metal dichalcogenide thin-film contains the third region, the first region includes the N+M molecular layers; the second region includes the N molecular layers; the N molecular layers of the second region include a lower stack of Z molecular layers and an upper stack of L molecular layers. That is, N=Z+L. In this connection, N is at least 2 natural numbers, each of Z and L is a positive integer. The third region is horizontally adjacent to the second region. The third region includes a stack of Z further molecular layers. The Z further molecular layers of the third region extend respectively horizontally from the Z molecular layers of the second region.

In this connection, a hetero-junction may be defined between at least one of the first region and the second region and the third region. The transition-metal dichalcogenide thin-film containing the third region may have multiple hetero-junctions defined between the plurality of regions. In this connection, in one example, in the Z molecular layers, Z may be 1.

In FIG. 1C, the third region is adjacent to the second region. However, in another embodiment of the present disclosure, the third region may be horizontally adjacent to the first region.

That is, the transition-metal dichalcogenide thin-film of the present disclosure may comprise at least one pair of the first region, the second region, and the third region, which are regularly or irregularly horizontally adjacent to each other.

Further, in one example, the transition-metal dichalcogenide thin-film of the present disclosure may further include an n-th region (n being a natural number of 4 or more) including at least one molecular layer and adjacent to the first to third regions.

As for the photoelectronic device, when the photoelectronic device has the configuration of the transition-metal dichalcogenide thin-film as shown in FIG. 1C. a sharp photocurrent peak may be realized at the hetero-junction (hereinafter, 2-3 hetero-junction) formed between the second region and the third region. Such a sharp photocurrent peak may be caused by the following reason. The second region and the third region have greater optically activity than the first region having the relatively larger number of the molecular layers and thus being relatively thick. Thus, electron-hole pairs may be generated more effectively at the 2-3 hetero-junctions.

Further, when excitons generated in the third region are diffused toward the second region and then travel to the 2-3 hetero-junction. Because of the low exciton binding energy in the second region, the excitons are separated at the 2-3 hetero-junction. The separated excitons act as additional carriers.

In addition, when the distance between the source electrode and the 2-3 hetero-junction is configured to be longer than the hole diffusion length, hole-electron recombination occurs before the holes are diffused to the source electrode. As a result, the phenomenon that charge is trapped in the oxide layer under the source electrode region may be reduced. Therefore, a rapid transient response may be realized at the 2-3 hetero-junction.

Thus, photoelectronic device of the present disclosure, including the transition-metal dichalcogenide thin-film containing the multi-hetero-junctions may exhibit excellent device performance. In this connection, the transition-metal dichalcogenide thin-film of the present disclosure may serve as a channel layer.

The photoelectronic device may be embodied as a device such as a photodetector, a photodiode, or a phototransistor. In one example, the photoelectronic device may be a field effect transistor.

In order to produce the transition-metal dichalcogenide thin-film of the present disclosure, a transition-metal dichalcogenide thin-film containing N+M molecular layers with a first mask pattern defined thereon is subjected to atomic layer etching (ALE) process. As a result, the transition-metal dichalcogenide thin-film may be formed which include the first region including a stack of N+M transition-metal dichalcogenide molecular layers, and a second region including a stack of N transition-metal dichalcogenide molecular layers, wherein the second region is horizontally adjacent to the first region, wherein the N transition-metal dichalcogenide molecular layers of the second region respectively horizontally extend from the N transition-metal dichalcogenide molecular layers of the first region (step (a)).

In this connection, each of N and M is a positive integer. That is, the transition-metal dichalcogenide thin-film incorporating the N+M molecular layers includes at least two molecular layers.

Figure 3:
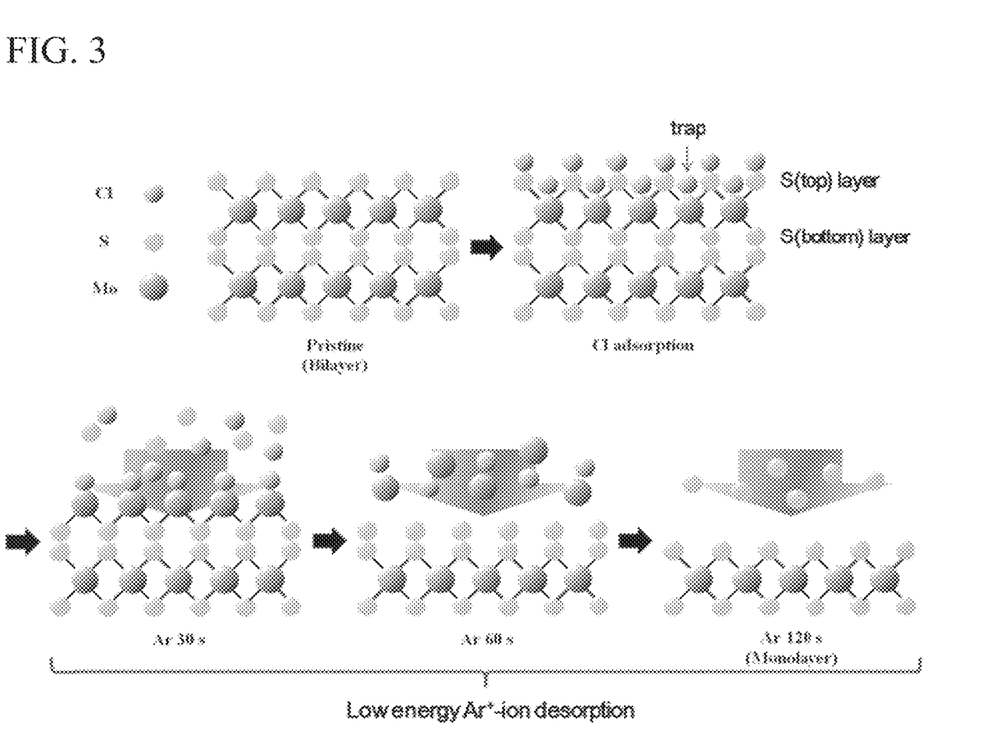
FIG. 3 is an illustration of a method for producing a transition-metal dichalcogenide thin-film of the present disclosure.

The ALE process may be etching using plasma. In this process, a step of chemical adsorption using a radical, and a step of physical desorption by a reactive compound may constitute one cycle. Referring to FIG. 3, with reference to a specific example using $MoS_2$ as the transition-metal dichalcogenide, the method for producing the transition-metal dichalcogenide thin-film will be more specifically illustrated.

FIG. 3 is an illustration of a method for producing a transition-metal dichalcogenide thin-film of the present disclosure.

Referring to FIG. 3, first, a $MoS_2$ thin-film has a layered structure made of $MoS_2$ molecules. A monolayer of the structure has a top S atom layer and a bottom S atom layer and a Mo atom layer interposed therebetween. In this connection, the $MoS_2$ thin-film is exposed to radicals such as Cl or O. Thereby, the radical (Cl) is adsorbed onto the top S atom. The radical is trapped between the top S layer and the Mo layer via a van der Waals force (chemical adsorption step).

Then, a desorption process using a reactive compound such as Ar+ cations is then performed. Since the adsorbed radical reacts with the top S atom and the binding energy of the top S atom is lowered, the top S atom is first removed from the S—Cl crystal structure when the monolayer is exposed to the reactive compound Ar cations.

Thereafter, the trapped radical reacts with Mo to form Mo—Cl, thereby weakening the bond between Mo and bottom S. Thus, the reactive compound may allow Mo to be removed from the crystal structure. The bottom S atom is removed via the selective sputtering of the reactive compound (physical desorption step). In this way, one $MoS_2$ molecular layer may be removed. In this connection, a reactive compound may be provided in the form of an ion beam.

When chemical adsorption by the radicals or physical desorption by the reactive compounds are respectively carried out in the conventional approach, no change appears on the surface of the material to be etched. However, according to the present disclosure, when the chemical adsorption and the physical desorption constitute in one process cycle which in turn is executed, the monolayer may be removed without damaging the material to be etched.

According to the present disclosure, the transition-metal dichalcogenide thin-film having the first mask pattern defined thereon may be selectively etched by the ALE (atomic layer etching) process using plasma. Compared with conventional wet etching or conventional etching using annealing process, the molecular layer may be removed to have a more precise target pattern and size according to the present disclosure. Further, compared to the conventional wet etching or conventional etching using annealing process, the process temperature is lowered (room temperature) according to the present disclosure. Thus, since the transition metal dichalcogenide thin film is not damaged by the present approach, the number of molecular layers may be controlled stably and precisely.

In this connection, in order to achieve the configuration that the transition-metal dichalcogenide thin-film includes the first region including a stack of N+M transition-metal dichalcogenide molecular layers, and a second region including a stack of N transition-metal dichalcogenide molecular layers, wherein the second region is horizontally adjacent to the first region, wherein the N transition-metal dichalcogenide molecular layers of the second region respectively horizontally extend from the N transition-metal dichalcogenide molecular layers of the first region, the step (a) in which the transition-metal dichalcogenide thin-film containing the N+M molecular layers with the first mask pattern defined thereon is subjected to the atomic layer etching (ALE) process may be repeated M times. That is, the atomic layer etching process may be repeated to control the target number of the molecular layer. In this connection, N may be at least one.

In other words, when performing the atomic layer etching (ALE) on the transition-metal dichalcogenide thin-film having the mask pattern defined on the mask, the ALE process may be selectively controlled such that the transition metal dichalcogenide thin film has a target pattern and a target number of the molecular layers. In this way, the transition-metal dichalcogenide thin-film of the present disclosure may be produced which includes the local regions with different numbers of molecular layers and has the hetero-junctions defined between the local regions.

Further, after step (a), a second mask pattern is formed on a transition-metal dichalcogenide thin-film having the second region. With the second mask pattern being formed on the metal dichalcogenide thin-film, atomic layer etching (ALE) was performed on the metal dichalcogenide thin-film. This may result in formation of a transition-metal dichalcogenide thin-film with the third region containing N–K (N–K is a positive integer) molecular layers. This may be referred to as step (b). Based on the above description, N–K=Z.

In this connection, in the step (b), the atomic layer etching process as illustrated in the step (a) may be performed once. Alternatively, in the step (b), the process of etching a single molecular layer may be repeated K times so that the third region may have a desired number (N–K) of molecular layers (N–K is a positive integer).

In another embodiment, in step (b), a portion of the stack of the first region including N+M molecular layers may be etched such that a fourth region including N+M–K molecular layers may be formed adjacently to the third region. Specifically, in the step (b), while the third region including the N–K molecular layer is formed, the first region including N+M molecular layers as not etched in the step (a) is etched at the same time as the formation of the third region such that the fourth region including N+M–K molecular layers is formed. In this connection, in one example, when K is equal to M, the fourth region defines the second region including N molecular layers.

In this process, the mask pattern may be formed by carrying out a process of at least one of a photolithography, and a directed self-assembly (DSA) lithography using a block copolymer (BCP). In this connection, forming the mask pattern on the transition-metal dichalcogenide using the lithography may allow formation of various patterns having a line width (width of each of the regions) of 10 nm or smaller.

According to the present disclosure, in the state where the mask pattern with various desired shapes is formed on the transition metal dichalcogenide thin film, the atomic layer etching (ALE) process is selectively performed on the transition-metal dichalcogenide thin-film. As a result, the transition-metal dichalcogenide thin-film of the present disclosure may be produced in which a plurality of local regions thereof having different numbers of the molecular layers define various patterns and various hetero-junctions.

Hereinafter, with reference to specific examples, the transition-metal dichalcogenide thin-film of the present disclosure and the functional device including the thin-film will be described in more detail.

First, $MoS_2$ was used as transition-metal dichalcogenide. On the $Si/SiO_2$ substrate, the $MoS_2$ thin-film having the number of molecular layers was formed. After forming a mask pattern on the $MoS_2$ thin film, the plasma atomic layer etching (ALE) was subsequently performed on the $MoS_2$ thin-film. As a result, the structure including a monolayer $MoS_2$ region and a multi-layers $MoS_2$ region as bonded to each other was produced. This structure is hereinafter referred to as a monolayer/multiple-layers hetero-junction $MoS_2$ thin-film. Then, source and drain electrodes (Au/Ti) were formed on the monolayer/multiple-layers hetero-junction $MoS_2$ thin-film. Thus, according to Example 1 of the present disclosure, the device (hereinafter referred to as a field effect transistor) including the monolayer/multiple-layers hetero-junction $MoS_2$ thin-film was manufactured.

Figure 4:
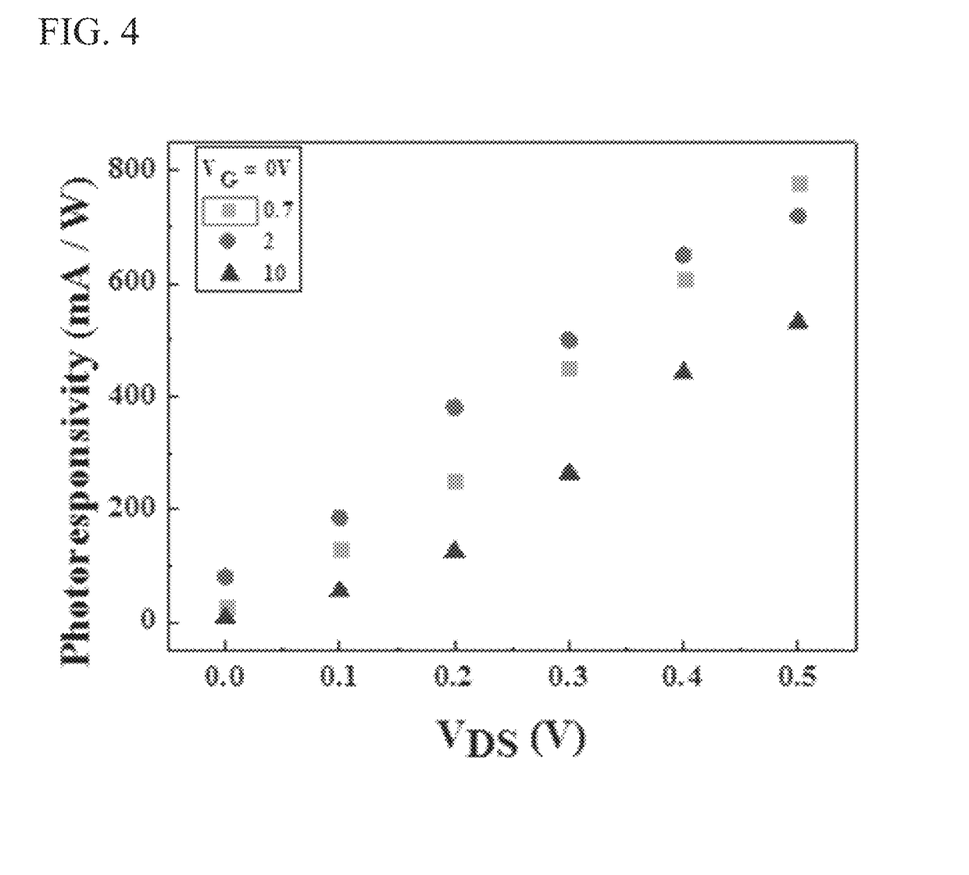
FIG. 4 is an illustration of an effect of improving photoresponsivity of a field effect transistor according to one embodiment of the present disclosure.

Then, the photoresponsivity of the field effect transistor according to the example 1 of the present disclosure was measured, and the results are shown in FIG. 4.

FIG. 4 illustrates the effect of improving the photoresponsivity of a field effect transistor according to one embodiment of the present disclosure.

Referring to FIG. 4, the $MoS_2$ field effect transistor according to Example 1 of the present disclosure was measured in terms of photoresponsivity under various values of laser powers. In the $MoS_2$ field effect transistor according to Example 1 of the present disclosure has a high photoresponsivity value as compared to the photodetector device that includes a monolayer $MoS_2$ thin-film that does not include a hetero junction structure as a channel. This means that the photoresponsivity of the field-effect transistor comprising the monolayer/multiple-layers hetero-junction $MoS_2$ thin-film of the present disclosure is superior to the device comprising the monolayer $MoS_2$ thin film.

That is, the transition-metal dichalcogenide thin-film with the multiple hetero-junctions between the monolayer/multiple-layers of the present disclosure may exhibit better photoresponsivity than the monolayer-based transition-metal dichalcogenide thin-film. Thus, it may be seen that optoelectronic device including the multiple hetero-junctions-based transition-metal dichalcogenide thin-films of the present disclosure may exhibit superior performance compared to the convention case.

Since the monolayer $MoS_2$ with a direct band gap has a high exciton binding energy of about 0.47 eV, an electron and a hole generated by photoexcitation in the monolayer $MoS_2$ may be recombined fast. Thus, compared to an optoelectronic device including a multilayer $MoS_2$ as a channel, an optoelectronic device including the monolayer $MoS_2$ as a channel has a lower photo-responsivity. However, compared to the optoelectronic device including the multilayer $MoS_2$, the optoelectronic device including the monolayer $MoS_2$ has a fast decaying time in an off-time period of a photoresponse time according to laser irradiation on/off, because there are almost never remaining photo carriers in the monolayer $MoS_2$, due to the fast recombination of the electron and the hole in the monolayer $MoS_2$.

Since the multilayer $MoS_2$ is thicker than the monolayer $MoS_2$ and has a lower exciton binding energy than that of the monolayer $MoS_2$, an amount of photo carriers generated by photoexcitation in the multilayer $MoS_2$ is larger in number than those in the monolayer $MoS_2$. Therefore, the optoelectronic device including the multilayer $MoS_2$ is a higher photo-responsivity than that of the optoelectronic device including the monolayer $MoS_2$ and has a fast rising time in an on-time period of the photoresponse time according to laser irradiation on/off. However, since the photo carriers are trapped between molecular layers in the multilayer $MoS_2$, at least some of the photo carriers remain in the off-time of the photoresponse time.

Since the present invention includes the monolayer $MoS_2$ and the multilayer $MoS_2$ which form a heterojunction therebetween, the present invention has advantages of the monolayer $MoS_2$ and the multilayer $MoS_2$ and is capable of compensating weaknesses of the monolayer $MoS_2$ and the multilayer $MoS_2$. In addition, the optoelectronic device including the heterojunction of the monolayer $MoS_2$ and the multilayer $MoS_2$ generates photocurrent which is larger than that generated by the optoelectronic device including the monolayer $MoS_2$ or the multilayer $MoS_2$, because a interlayer gap (~0.61 eV) between the monolayer $MoS_2$ and the multilayer $MoS_2$ is lower than band gaps of the monolayer $MoS_2$ (~1.9 eV) and the multilayer $MoS_2$ (~1.29 eV), and therefore, the optoelectronic device including the heterojunction of the monolayer $MoS_2$ and the multilayer $MoS_2$ has a higher photoresponsivity than that of the optoelectronic device including the monolayer $MoS_2$ or the multilayer $MoS_2$.

According to the present invention including the multi-heterojunction formed by the photolithography process or the DSA lithography process, performance of the optoelectronic device can be maximized.

In the above description, numerous specific details are set forth in order to provide a thorough understanding of the present disclosure. The present disclosure may be practiced without some or all of these specific details. Examples of various embodiments have been illustrated and described above. It will be understood that the description herein is not intended to limit the claims to the specific embodiments described. On the contrary, it is intended to cover alternatives, modifications, and equivalents as may be included within the spirit and scope of the present disclosure as defined by the appended claims.

What is claimed is:
1. A semiconductor device comprising:
a substrate; and
a transition-metal dichalcogenide thin-film disposed on the substrate,
wherein the transition-metal dichalcogenide thin-film includes at least two pairs of a first region and a second region,
wherein:
the first region includes a stack of N+M transition-metal dichalcogenide molecular layers; and
the second region includes a stack of N transition-metal dichalcogenide molecular layers,
wherein the second region is horizontally adjacent to the first region, and
wherein the N transition-metal dichalcogenide molecular layers of the second region respectively horizontally extend from the N transition-metal dichalcogenide molecular layers of the first region.

2. The semiconductor device of claim 1, wherein the transition-metal dichalcogenide thin-film further includes a third region,
   wherein the third region is horizontally adjacent to the second region,
   wherein the stack of the N molecular layers of the second region is divided into a lower stack of Z molecular layers and an upper stack of L molecular layers,
   wherein the third region includes a stack of Z further molecular layers, and
   wherein the Z further molecular layers of the third region extend respectively horizontally from the Z molecular layers of the second region.

3. The semiconductor device of claim 1, wherein the molecular layer is made of a compound between one atom of transition-metal selected from molybdenum (Mo), tungsten (W), tin (Sn), cadmium (Cd), and zinc (Zn), and two atoms of chalcogen selected from selenium (Se) sulfur (S), and tellurium (Te).

4. A photoelectronic device comprising:
   a substrate; and
   a transition-metal dichalcogenide thin-film disposed on the substrate; and
   electrodes disposed on the transition-metal dichalcogenide thin-film,
   wherein the transition-metal dichalcogenide thin-film includes:
   a first region including a stack of N+M transition-metal dichalcogenide molecular layers; and
   a second region including a stack of N transition-metal dichalcogenide molecular layers,
   wherein the second region is horizontally adjacent to the first region, and
   wherein the N transition-metal dichalcogenide molecular layers of the second region respectively horizontally extend from the N transition-metal dichalcogenide molecular layers of the first region.

5. The photoelectronic device of claim 4, wherein the transition-metal dichalcogenide thin-film include at least two pairs of the first region and the second region.

6. The photoelectronic device of claim 4, wherein the transition-metal dichalcogenide thin-film further includes a third region, wherein the third region is horizontally adjacent to the second region,
   wherein the stack of the N molecular layers of the second region is divided into a lower stack of Z molecular layers and an upper stack of L molecular layers,
   wherein the third region includes a stack of Z further molecular layers, and
   wherein the Z further molecular layers of the third region extend respectively horizontally from the Z molecular layers of the second region.

7. The photoelectronic device of claim 4, wherein the molecular layer is made of a compound between one atom of transition-metal selected from molybdenum (Mo), tungsten (W), tin (Sn), cadmium (Cd), and zinc (Zn), and two atoms of chalcogen selected from selenium (Se) sulfur (S), and tellurium (Te).

8. The photoelectronic device of claim 4, wherein the photoelectronic device includes at least one of a photodetector, a photodiode, and a phototransistor.

* * * * *